United States Patent [19]
Channin

[11] 3,934,199
[45] Jan. 20, 1976

[54] METHOD OF TESTING AN ELECTRICAL CIRCUIT

[75] Inventor: Donald Jones Channin, East Windsor, N.J.

[73] Assignee: RCA Corporation, N.Y.

[22] Filed: Mar. 28, 1974

[21] Appl. No.: 455,833

[52] U.S. Cl. ............ 324/158 R; 324/73 R; 324/96; 324/158 D; 350/160 LC
[51] Int. Cl.² ........................................ G01R 31/22
[58] Field of Search ........ 324/158 D, 158 T, 158 R, 324/73 R, 72, 96; 350/160 LC

[56] References Cited
OTHER PUBLICATIONS
"Spotting IC Pin Holes with Liquid Crystals"; Electronics; Feb. 28, 1972; pp. 6E, 7E.

Primary Examiner—John Kominski
Assistant Examiner—Ernest F. Karlsen
Attorney, Agent, or Firm—H. Christoffersen

[57] ABSTRACT

A non-destructive method of testing an electrical circuit includes observing birefringent changes in a layer of liquid crystals during the operation of the circuit. The method comprises applying the layer of liquid crystals over the circuit with the liquid crystal molecules oriented in the same direction. A beam of light is directed through the layer of liquid crystals with an optical system adapted to make the birefringent changes visible. The circuit is energized with either an ac or a dc voltage, and the birefringent changes produced by the electric fields, and/or the currents, and/or the temperature distributions in the layer of liquid crystals are observed so that a comparison can be made between the observed birefringent changes and birefringent changes produced by a normally operating circuit.

4 Claims, 4 Drawing Figures

METHOD OF TESTING AN ELECTRICAL CIRCUIT

This invention relates generally to a method of testing an electrical circuit, and more particularly to a non-destructive method of testing an electrical circuit by observing birefringent changes in a layer of liquid crystals applied over the circuit during the operation of the circuit. The novel method of the present invention is particularly useful for testing relatively complex integrated circuits in a non-destructive manner.

Liquid crystal techniques have been proposed for studying semiconductor devices. The prior-art liquid crystal techniques, however, rely on observing only changes in the color and/or the opacity of the liquid crystals to indicate certain operating characteristics of the semiconductor device. Temperature changes in a circuit device, for example, cause coloration effects in cholesteric liquids; and electrical conduction in nematic liquids produce a turbulence phenomenon known as dynamic scattering. By way of contrast, the novel method of testing electrical circuits makes use of birefringent changes (optical phase changes) in a clear layer of liquid crystals.

A serious difficulty in the development and manufacture of integrated circuits has been the inability to observe or to measure the internal functioning of these circuits easily. Complex integrated circuits of the type comprising more than 100 transistors and a corresponding number of interconnections and crossovers, for example, have been tested in the prior art by examining the outputs of these circuits at a plurality of terminals. One is obviously handicapped when he tries to diagnose a fault location and failure mechanism of an improperly operating device or circuit. Even very simple integrated circuits are not easily probed for electric fields and currents within individual transistors or other structures. The importance of a practical method of testing integrated circuits by making visible their electric fields, currents, and temperature patterns is, therefore, quite apparent.

Briefly stated, the present novel method of testing an electrical circuit comprises applying a layer of liquid crystals over the circuit with substantially all of the liquid crystal molecules oriented in the same direction. A beam of light is directed through the layer of liquid crystals with an optical system adapted to make visible any birefringent changes occurring in the liquid crystal layer during the operation of the circuit. The circuit is energized with either an ac or dc voltage, and the birefringent changes in the layer of liquid crystals due to the electric fields, and/or the currents, and/or the temperature distributions in the energized circuit are observed. The observed birefringent changes can then be compared with birefringent changes produced by a similar normally operating circuit to determine the condition of the circuit under test.

By the term "layer of liquid crystals" is meant a layer of liquid crystal material; and by the term "molecules oriented in the same direction" is meant that the layer has a substantially unidirectional liquid ordering or orientation, as opposed to a random orientation.

The novel method will be explained with the aid of the accompanying drawings wherein.

Similar parts will be designated by similar reference numerals in each of the FIGS. 1–4.

Figure 1:
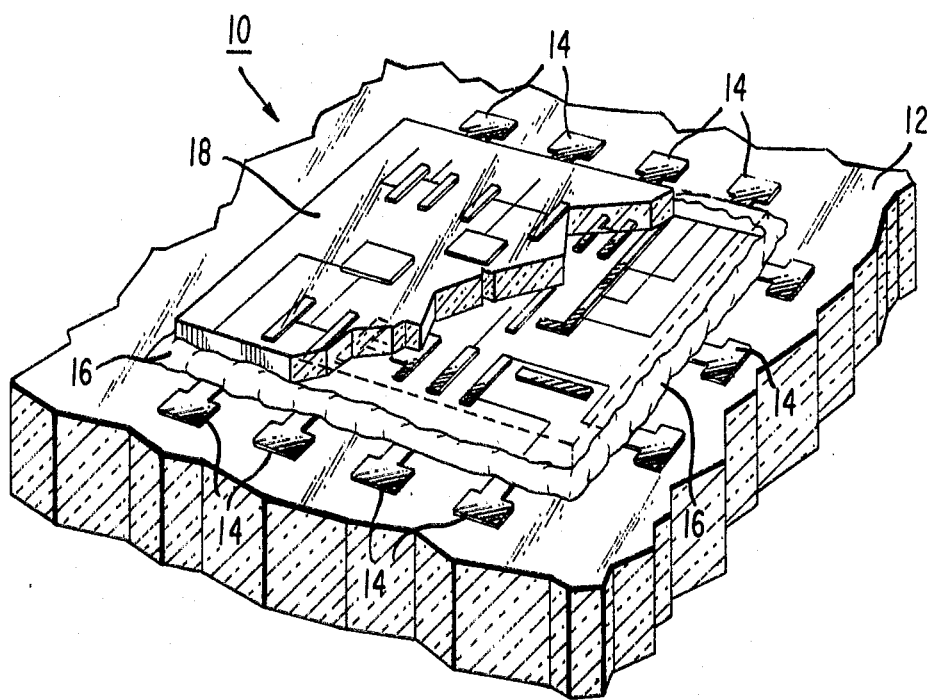
FIG. 1 is a fragmentary, perspective view of an electrical circuit on a substrate, showing a layer of liquid crystals over the circuit, and a cover glass (with parts cut away) over the layer of liquid crystals in preparation for testing the circuit by the novel method.

Referring now to FIG. 1 of the drawing, there is shown a semiconductor chip 10 for an electrical circuit either of the integrated type, thin film type, or thick film type used in the semiconductor art. The chip 10 comprises a substrate 12 such as of silicon, for example, for supporting a plurality of metalized interconnections, including terminals 14, between circuit elements either diffused in, or disposed on, the substrate 12, in a manner well known in the semiconductor art. The circuit is cleaned, as by boiling it in trichlorethylene for about 10 minutes, and a layer 16 of liquid crystals is applied over the cleaned circuit. The liquid crystal layer 16 can be applied easily from a hypodermic syringe. A cover glass 18 is applied over the layer 16.

The liquid crystal layer 16 is preferable of the nematic type, such as N-(p-methoxybenzilidene) -p-butylaniline (called MBBA), N-(p-ethoxybenzilidene) -p-butylaniline called (EBBA), Liquid Crystal 11900 of Eastman Organic Chemical, Eastman Kodak Co., Rochester, N.Y. or mixtures of MBBA and EBBA, for example. Cholesteric liquid crystals, such as cholesteryl oleyl carbonate, for example, can also be used.

Figure 2:
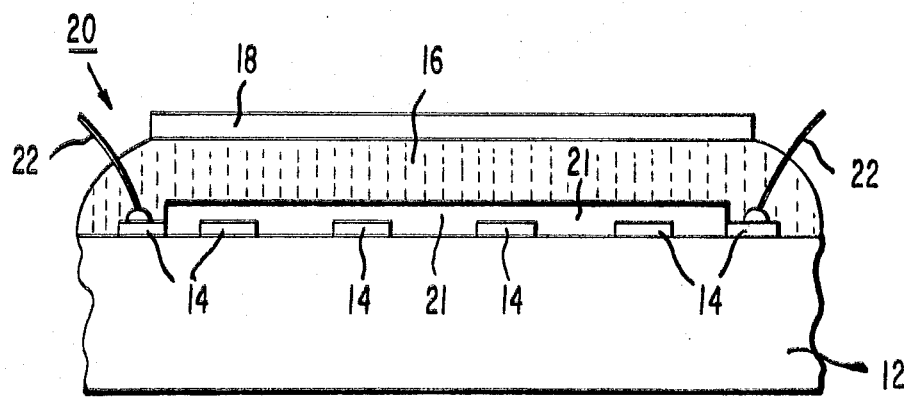
FIG. 2 is a cross-sectional view of a circuit on a substrate, showing a passivating layer, a layer of liquid crystals, and a cover glass over the circuit, in the order named.

Referring now to FIG. 2 of the drawing, there is shown a chip 20 for an integrated circuit substantially similar to that shown in FIG. 1 with the exception that a passivating layer 21, such as of silicon dioxide, for example, is applied over the integrated circuit, except for the terminals 14. Electrical connections to the terminals 14 are made by wires 22, either bonded to the terminals 14 or held in mechanical contact with them for energizing the circuit from a suitable power supply (not shown). The liquid crystal layer 16 is over the passivating layer 21; and the cover glass 18 is over the layer 16.

The cover glass 18 is sufficiently light in weight so that the surface tension of the liquid crystals draws the cover glass 18 against the liquid crystals, forcing the liquid crystals to form the layer 16 of uniform thickness. The viscosity of the liquid crystal layer 16 is sufficient to maintain the light cover glass 18 in position. The cover glass 18 may, however, be moved about slightly over the circuit by pushing it with a probe, or the like. The cover glass 18 should be of a size such that it covers the active portions of the circuit but allows access to the terminals 14 at the periphery of the circuit for providing electrical connections (e.g. wires 22) thereto.

The liquid crystal molecules must have specific and uniform orientation with respect to their confining surfaces of the cover glass 18 and the circuit. The uniform orientation (ordering) of the liquid crystal molecule is accomplished by treating the surfaces that are in contact with the liquid crystal layer 16 with a suitable surfactant that promotes the alignment of the liquid crystal molecules. A satisfactory technique for promoting a molecular alignment perpendicular to the confining surfaces is to apply a drop of a solution of lecithin dissolved in trichlorethylene (lg lecithin in 40 ml trichlorethylene) to the circuit and then spin it rapidly to dry it, leaving a uniform coating of the dried liquid on the surface. The surface of the cover glass 18 is also coated with the lecithin solution, as by touching it momentarily to a filter paper dampened with the lecithin solution and allowing the cover glass 18 to dry. In addition to the surfactant, lecithin, other surfactants, such as N, N-dimethyl -N- octadecyl-3-amino proplytrimethoxy silyl chloride (called DMOAP, sold by Dow Corning as XZ2-2300), for example, may also be used. It is also with in the contemplation of the novel method to dissolve a suitable surfactant in the liquid crystal layer 16 for orienting (ordering) the molecules therein, as described in U.S. Pat. No. 3,656,834.

Regions of selective changes in the orientation of the liquid crystal molecules are produced by various processes resulting from the operation of the circuit under test. Electric field effects that change the direction of the liquid crystal ordering are produced by electric fields associated with the operating circuit above a critical field strength. For liquid crystals of negative dielectric anisotropy such as MBBA, for example, the field component parallel to the original alignment produces this effect. For positive dielectric materials, the perpendicular field component acts. When there is an insulating layer, such as the passivating layer 21 (FIG. 2) between the liquid crystal layer 16 and the sources of the electric field, the field effect occurs only when the circuit is energized by ac or pulsed fields, since constant electric fields produce self-cancellation charge accumulations on the insulating surface of the passivating layer 21.

Electrical conduction effects are associated with the conduction of current in the liquid crystal layer 16 due to either defects in the (passivating) insulating layer 21 over the circuit under test or to the absence of such an insulating layer 21. The conduction effects occur only for dc fields, and these effects distort the order (orientation) of the alignment molecules in the liquid crystal layer 16.

Nematic-isotropic transition (temperature) effects are due to a reversible phase transition from an ordered (nematic) state to an unordered or isotropic state occurring above a specific temperature. Thus, local heating of the circuit under test causes this effect in the region of the liquid crystal layer 16 adjacent to the heated region.

All of the aforementioned effects, namely the electric field effect, the conduction effect, and the nematic-isotropic transition (temperature) effect, may occur in the same circuit under test and reflect different aspects of the circuit operation. These effects do not require the electric fields or currents to completely traverse the liquid crystal layer 16, a partial penetration being sufficient. Hence, the resolution of these effects is not limited by the thickness of the liquid crystal layer 16.

Figure 3:
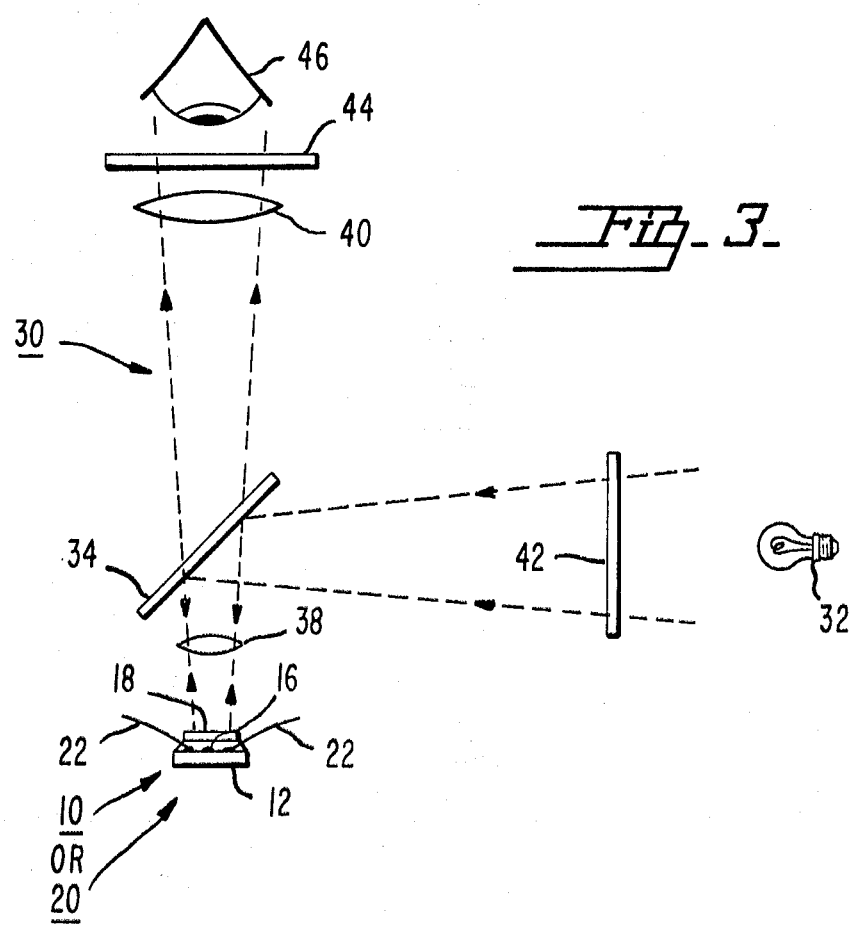
FIG. 3 is a schematic drawing of an optical system for directing a beam of light through a layer of liquid crystals on a circuit under test, in accordance with the novel method.

The aforementioned regional changes in the ordering of the liquid crystal layer 16 manifest themselves optically as refractive index inhomogeneities and polarization rotations because of the natural birefringence of the liquid crystal material. Referring now to FIG. 3 of the drawing, there is shown an optical system 30 for observing these inhomogeneities in the circuits on the chips 10 and 20 in FIGS. 1 and 2, respectively. The optical system 30 comprises essentially a standard metallurigical microscope having a light source 32, a half-silvered (semi-transparent) mirror 34, an objective lens 38, and an eyepiece 40. The optical inhomogeneities in the liquid crystal layer 16 are made visible by the action of linear polarizers 42 and 44 which are initially crossed to substantially extinguish reflected light from the ordered liquid crystal molecules on the circuit under test. The optical homogeneities in the birefringent liquid crystal layer 16 rotate the polarization of light passing through the liquid crystal layer 16, allowing it to pass through the polarizer (analyzer) 44. Thus, light from the light source 32 passes through the polarizer 42, is reflected from the mirror 34, passes through the objective lens 38, and is directed through the liquid crystal layer 16 on the circuit on the chip 10 or 20. The polarized light is then reflected back through the liquid crystal layer 16, through the objective lens 38, the semi-transparent mirror 34, the eyepiece 40, the polarizer (analyzer) 44, and into the eye 46 of an observer. What is observed are bright images of the optical phase changes induced in the liquid crystal layer 16 by the electric fields on the surface of the integrated circuit, and/or electrical conduction through defects in the passivating (insulation) layer 21 and/or regions on the circuit where the conduction causes local heating sufficient to produce a nematic-isotropic (temperature) transition.

It is within the contemplation of the present invention to use optical systems employing means other than the linear polarizers 42 aand 44 to detect the birefringence and rotary effects in the liquid crystal layer 16 on the circuit under test. For example, crossed circular polarizers, phase contrast, and Schlieren optical systems may also be used since these optical systems are also sensitive to bifringence and rotary effects in the liquid crystal layer 16.

Figure 4:
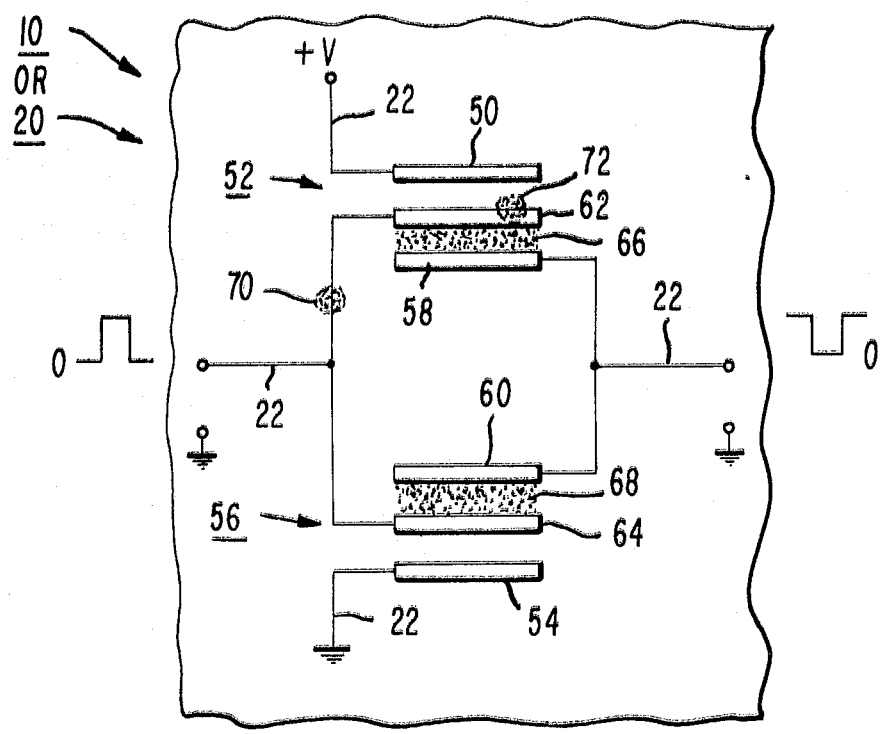
FIG. 4 is a schematic diagram of a portion of a circuit under test by the novel method, showing where birefringent changes may occur during the testing procedure.

Examples of observed effects in an integrated circuit under test (such as on the chips 10 or 20, for example) by the novel method will now be described in conjunction with the schematic diagram of FIG. 4. FIG. 4 is a diagram of a complementary MOS (metal-oxide-semiconductor) integrated circuit that functions as an inverter. A source electrode 50 of a P-channel transistor 52 is connected to a source of positive voltage, +V (say +9V) and a source electrode 54 of an N-channel transistor 56 is connected to ground. With zero volts input, as when the gate electrodes 62 and 64 of the transistors 52 and 56 are grounded, the P-channel transistor 52 conducts, and the N-channel transistor 56 is turned off, so that a drain electrode 58 of the P-channel transistor 52 is at the +V voltage, as is also a drain electrode 60 of the N-channel transistor 56. Upon the application of a positive pulse (say +9V) to the gate electrode 62 of the P-channel transistor 52 and to the gate electrode 64 of the N-channel transistor 56, the N-channel transistor 56 conducts and a P-channel transistor 52 is turned off, causing the drain electrodes 58 and 60 to switch to zero voltage for the duration of the applied pulse. Under these conditions, an inverted pulse (going from +V to 0) is obtained at the output of the drain electrodes 58 and 60. Thus, when a pulse train of positive pulses is applied to the gate electrodes 62 and 64, the regions between the gate electrode 62 and the drain electrode 58 oscillates in voltage with the frequency of the applied pulse train, as does the region between the gate electrode 64 and the drain electrode 60.

If the circuit of FIG. 4 is incorporated in the assembly described for the circuits on the chips 10 and 20, illustrated in FIGS. 1 and 2, and if the voltages and frequencies are appropriate to cause the aforementioned electric field effects in the liquid crystal layer 16, bright regions 66 and 68 (FIG. 4) will appear in the regions of changing field when viewed by the aforementioned optical system 30 (FIG. 3), giving a visible representation of the changing voltage distribution in these regions. Flaws in the circuit under test, such as a lack of continuity of conduction regions that distort these electric fields, will become apparent. Regions of high or low electric fields will also be made visible. Failure of a transistor, for example, to operate will be made evident by the absence of a bright (birefringent) pattern.

In one type of circuit flaw, as when a crack exists in the passivating layer 21 of the device 20, current conduction from the circuit conductors into the liquid crystal layer 16 occurs. This flaw produces a bright region, as at 70 (FIG. 4), when the circuit is activated by a dc voltage applied to the gate electrodes 62 and 64. This bright region 70 caused by the dc conduction of current, is distinguished from the bright regions 66 and 68, caused by electric field effects because the latter occurs only when the circuit is energized with a time-varying potential (ac or pulsed voltage). The bright region 70 is caused only when the circuit is energized by a dc voltage.

In another type of flaw, conduction may occur in localized parts of the circuit, causing localized heating. A hot region of the circuit under test, as for example region 72 (FIG. 4), is observed as a bright spot by the optical system 30 when the temperature for transition from the nematic to isotropic material is exceeded. Bright regions (birefringent changes) caused by hot spots can easily be distinguished from the other effects in the optical system 30. In the novel method, these birefringent changes are observed with nematic liquid crystal material.

The operation of a complex integrated circuit having many transistors and circuits operating in sequence, such as a multi-stage counter, can be observed with the aforementioned techniques. The input pulse rate can be applied slowly enough so that the progress of the pulses through the different circuit stages can be followed visually, and improper operation of the complex circuit can be detected. Hence, by observing these birefringent changes in a circuit under test, one can compare them with birefringent changes produced by a normally operating circuit to evaluate the circuit under test.

By adjusting the polarizers 42 and 44 (FIG. 3) so that they are not completely crossed prior to circuit operation, the bright liquid crystal regions associated with the circuit operation are viewed superimposed on the circuit itself. Thus, the correspondence between the birefringent patterns induced in the liquid crystal layer 16 and the specific elements of the circuit are made evident.

Thus, there has been shown and illustrated a novel method for observing the electric fields, currents, and excessive temperatures at the surface of an operating circuit of the integrated circuit, thin film, or thick film type. The display of these visual effects is clear and vivid at high magnification. The novel method is non-destructive and involves no special preparation of the circuit under test other than the application of a liquid crystal layer than may be easily removed. The circuits under test are operated in their usual manner and within their voltage and current specifications. At low repetition rates the propagation of pulses through complicated counter and logic circuits may be observed. The ability of the novel method to locate and study circuit defects and weaknesses has been confirmed. One employing the novel method may also view the uniformity of electric fields and currents along the device junctions to search for hot spots and high electric field concentrations in functioning devices, in addition to identifying working and non-working areas of the circuit.

The novel method requires only a conventional microscope and electronics of the type that are generally used in integrated circuit development laboratories. packaged circuits or unscribed wafers may be coated with a liquid crystal layer in batches and then observed at convenient times in numerous locations. Previously examined circuits may be stored, reexamined, and compared with the most recent circuits devices. By manipulating the driver (energizing) voltage and repetition rates, birefringent changes in a circuit under test can be observed in slow motion operation and then examined in detail for field uniformity at various places in the circuit, and for local heating.

What is claimed is:

1. A method of testing an electrical circuit by observing birefringent changes in a layer of liquid crystals produced by electric fields in the circuit during the operation of the circuit, said method comprising the steps of:

applying said layer of liquid crystals over said circuit with substantially all of the liquid crystal molecules oriented in the same direction, directing a beam of light through said layer with an optical system adapted to make said birefringent changes visible, energizing said circuit to produce said birefringent changes, observing said birefringent changes with said optical system, whereby the observed birefringent changes can be compared with birefringent changes produced by a normally operating circuit, said circuit having a passivating layer of insulating material thereon, and the step of applying said layer of liquid crystals over said circuit with substantially all of the liquid crystal molecules oriented in the same direction comprising:

applying a surfactant to said passivating layer, drying said surfactant on said passivating layer, and applying said layer of liquid crystals over the dried surfactant.

2. A method of testing an electrical circuit by observing birefringent changes in a layer of liquid crystals produced by electric fields in the circuit during the operation of the circuit, said method comprising the steps of:

applying said layer of liquid crystals over said circuit with substantially all of the liquid crystal molecules oriented in the same direction, directing a beam of light through said layer with an optical system adapted to make said birefringent changes visible, energizing said circuit to produce said birefringent changes, observing said birefringent changes with said optical system, whereby the observed birefringent changes can be compared with birefringent changes produced by a normally operating circuit, the step of applying said layer of liquid crystals over said circuit with substantially all of the liquid crystal molecules oriented in the same direction comprising:

applying a surfactant over said circuit, drying said surfactant, and applying said layer of liquid crystals over the dried surfactant on said circuit.

3. A method of testing an electrical circuit by observing birefringent changes in a layer of liquid crystals produced by electric fields in the circuit during the operation of the circuit, said method comprising the steps of:

applying said layer of liquid crystals over said circuit with substantially all of the liquid crystal molecules oriented in the same direction, directing a beam of light through said layer with an optical system adapted to make said birefringent changes visible, energizing said circuit to produce said birefringent changes, observing said birefringent changes with said optical system, whereby the observed birefringent changes can be compared with birefringent changes produced by a normally operating circuit, the step of applying said layer of liquid crystals over said circuit with substantially all of the liquid crystal molecules oriented in the same direction comprising:

applying said layer of liquid crystals, including a surfactant dissolved therein, over said circuit, and covering said layer of liquid crystals, including said surfactant dissolved therein, with a cover glass.

4. A method as described in claim 3 wherein:

the step of energizing said circuit to produce said birefringent changes comprises:

applying time-varying potentials to said circuit, whereby birefringent changes produced by electric field effects in said circuit may be observed.

* * * * *